(12) United States Patent
Vasak et al.

(10) Patent No.: US 8,928,165 B2
(45) Date of Patent: Jan. 6, 2015

(54) GENERATOR-FAULT-TOLERANT CONTROL FOR A VARIABLE-SPEED VARIABLE-PITCH WIND TURBINE

(71) Applicants: Mario Vasak, Novi Marof (HR); Vinko Lesic, Zupanja (HR); Thomas Wolbank, Vienna (AT); Nedjeljko Peric, Zagreb (HR)

(72) Inventors: Mario Vasak, Novi Marof (HR); Vinko Lesic, Zupanja (HR); Thomas Wolbank, Vienna (AT); Nedjeljko Peric, Zagreb (HR)

(73) Assignee: University of Zagreb Faculty of Electrical Engineering and Computing (HR)

( * ) Notice: Subject to any disclaimer, the term of this patent is extended or adjusted under 35 U.S.C. 154(b) by 0 days.

(21) Appl. No.: 14/245,544

(22) Filed: Apr. 4, 2014

(65) Prior Publication Data

US 2014/0246855 A1 Sep. 4, 2014

Related U.S. Application Data

(63) Continuation of application No. PCT/HR2011/000020, filed on May 20, 2011.

(60) Provisional application No. 61/516,884, filed on Apr. 11, 2011.

(51) Int. Cl.
| | | |
|---|---|---|
| F03D 9/00 | (2006.01) | |
| H02P 9/04 | (2006.01) | |
| F03D 7/00 | (2006.01) | |
| G01R 31/42 | (2006.01) | |
| H02P 29/02 | (2006.01) | |
| H02P 9/00 | (2006.01) | |
| G01R 31/34 | (2006.01) | |

(52) U.S. Cl.
CPC ............... *F03D 7/00* (2013.01); *G01R 31/42* (2013.01);*H02P 29/023* (2013.01); *H02P 9/006* (2013.01); *F03D 9/003* (2013.01); *G01R 31/343* (2013.01); *F05B 2270/107* (2013.01); *F05B 2270/1095* (2013.01); *F05B 2270/327* (2013.01); *F05B 2270/335* (2013.01)
USPC .................................................. 290/44; 290/55

(58) Field of Classification Search
USPC ........................................................ 290/44, 55
See application file for complete search history.

(56) References Cited

U.S. PATENT DOCUMENTS

| | | | | |
|---|---|---|---|---|
| 5,183,387 A | * | 2/1993 | Huggett et al. | ............... 416/147 |
| 5,493,195 A | | 2/1996 | Heglund et al. | |

(Continued)

FOREIGN PATENT DOCUMENTS

EP 1990539 A1 11/2008

OTHER PUBLICATIONS

H. Polinder, H. Lendenmann, R. Chin, W. M. Arshad, "Fault tolerant generator systems for wind turbines", IEEE International Electric Machines and Drives Conference, pp. 675-681 (2009).

(Continued)

*Primary Examiner* — Tulsidas C Patel
*Assistant Examiner* — Thomas Quigley
(74) *Attorney, Agent, or Firm* — St. Onge Steward Johnston & Reens LLC

(57) ABSTRACT

A fault-tolerant control system and method for variable-speed variable-pitch wind turbines with an inverter-fed generator. When generator faults are detected, the generator torque and/or flux is limited to prevent propagation of the faults and possible failure and shutdown of the generator. The control system and method improves on two-loop control methods for variable-speed variable-pitch wind turbines and provides improved power delivery under fault conditions.

14 Claims, 10 Drawing Sheets

(56) References Cited

U.S. PATENT DOCUMENTS

| | | | |
|---|---|---|---|
| 5,578,880 A * | 11/1996 | Lyons et al. | 310/90.5 |
| 5,705,869 A * | 1/1998 | Kliman et al. | 310/90.5 |
| 6,856,038 B2 | 2/2005 | Rebsdorf et al. | |
| 6,922,037 B2 | 7/2005 | Edelson | |
| 7,002,259 B2 | 2/2006 | Howes et al. | |
| 7,095,131 B2 | 8/2006 | Mikhail et al. | |
| 7,345,373 B2 | 3/2008 | Delmerico et al. | |
| 7,352,075 B2 | 4/2008 | Willey et al. | |
| 7,420,288 B2 | 9/2008 | Calley | |
| 7,564,208 B2 | 7/2009 | Bailey et al. | |
| 7,586,205 B2 | 9/2009 | Krueger | |
| 7,704,043 B2 | 4/2010 | Kabatzke et al. | |
| 7,780,412 B2 | 8/2010 | Zang et al. | |
| 8,350,397 B2 * | 1/2013 | Lang et al. | 290/44 |
| 2010/0025995 A1 * | 2/2010 | Lang et al. | 290/44 |
| 2010/0225113 A1 | 9/2010 | Harms et al. | |

OTHER PUBLICATIONS

J. Zhu, X. Niu, "Investigation of short circuit fault in a fault-tolerant brushless permanent magnet AC motor drive with redundancy", 5th IEEE Conference on Industrial Electronics and Applications (ICIEA), pp. 1238-1242 (2010).

J. Zhu, X. Niu, W. L. Soong, "Fault remedial strategies in a fault-tolerant brushless permanent magnet AC motor drive with redundancy", 6th IEEE International Power Electronics and Applications Conference, pp. 423-427 (2009).

W. Shuting, L. Yonggang, L. Heming, T. Guiji, "A compositive diagnosis method on turbine generator rotor winding inter-turn short-circuit fault", IEEE International Symposium on Industrial Electronics (ISIE), pp. 1662-1666 (2006).

W. Shuting, L. Yonggang, L. Heming, T. Guiji, "A new diagnosis method of rotor winding inter-turn short-circuit fault and imbalance fault based on stator and rotor vibration characteristics", Proc. 8th International Conference on Electrical Machines and Systems, pp. 2207-2210 (2005).

L. Tang, M. F. Rahman, "A direct torque controlled interior permanent magnet synchronous machine drive with a new stator resistance estimator", Record of the Conference on Industry Applications (38th IAS Annual Meeting), pp. 632-639 (2003).

Z. Sun, J. Wang, G. W. Jewell, D. Howe, "Enhanced optimal torque control of fault-tolerant PM machine under flux-weakening operation", IEEE Trans. Ind. Electron., vol. 57, No. 1, pp. 344-352 (2010).

J. Ribrant, L. M. Betting, "Survey of failures in wind power systems with focus on Swedish wind power plants during 1997-2005", IEEE Trans. Energy Conversion, vol. 22, No. 1, pp. 167-173 (2007).

Z. Daneshi-Far, G. A. Capolino, H. Henao, "Review of failures and condition monitoring in wind turbine generators", XIX International Conference on Electrical Machines (ICEM), pp. 1-6 (2010).

Y. Hu, L. Zhang, W. Huang, F. Bu, "A fault-tolerant induction generator system based on instantaneous torque control (ITC)", IEEE Trans. Energy Conversion, vol. 25, No. 2, pp. 412-421.

M. Jelavic, N. Peric, I. Petrovic, M. Kajari and S. Car, "Wind turbine control system", Proc. of the 7th Symposium on Power System Management, HO CIGRE, Nov. 2006, pp. 196-201.

F. D. Bianchi, H. De Battista and R. J. Mantz, Wind Turbine Control Systems—Principles, Modelling and Gain Scheduling Design., London, England: Springer, ISBN 1-84628-492-9, 2007.

T. Burton, D. Sharpe, N. Jenkins and E. Bossanyi Wind Energy Handbook, England: John Wiley & Sons, ISBN 0-471-48997-2, 2001.

K. E. Johnson, L. Y. Pao, M. J. Balas and L. J. Fingersh: Control of Variable-Speed Wind Turbines, IEEE Control Systems Magazine, 1066-033x, Jun. 2006, pp. 70-81.

M. Jelavic, N. Peric, and I. Petrovic, "Identification of Wind Turbine Model for Controller Design", in Proc. of the 12th International Power Electronics and Motion Control Conf. EPE—PEMC 2006, Aug. 30 -Sep. 1, 2006, pp. 1608-1613.

M. P. Kazmierkowski, F. Blaabjerg and R. Krishnan, Control in Power Electronics—Selected Problems, San Diego, California: Academic Press, An imprint of Elsevier Science, ISBN 0-12-402772-5, 2002.

M. Jelavic, N. Peric, I. Petrovic, S. Car and M. Madercic, "Design of a Wind Turbine Pitch Controller for Loads and Fatigue Reduction", Proc. of the European Wind Energy Conference & Exhibition—EWEC 2007, May 2007.

F. Blaabjerg, F. Iov, R. Teodorescu and Z. Chen. "Power Electronics in Renewable Energy Systems" Proc. of the 12th International Power Electronics and Motion Control Conf. (EPE-PEMC 2006), 2006.

J. Lewis and C. Muller, "A Direct Drive Wind Turbine HTS Generator" IEEE Power Engineering Society General Meeting, 2007.

P. Novak, T. Ekelund, I. Jovik and B. Schmidtbauer, "Modeling and control of variable-speed wind-turbine drive-system dynamics" IEEE Control system magazine, 15(4):28-38, Aug. 1995.

P. Schaak and T. G. van Engelen, "Torque control for variable speed wind turbines," Proc. of the European Wind Energy Conf.—EWEC 2004, UK, 2004.

* cited by examiner

GENERATOR-FAULT-TOLERANT CONTROL FOR A VARIABLE-SPEED VARIABLE-PITCH WIND TURBINE

FIELD OF THE INVENTION

A system and method for fault-tolerant control of variable-speed variable-pitch wind turbine is disclosed in which, subsequent to the occurrence of certain common generator faults, the turbine continues producing energy under modified, fault-managed conditions. The invention relies on employing torque or flux modulation to locally reduce electrical and/or mechanical stress on fault location in the generator and optimizing wind turbine operating parameters to maintain optimal energy generation under fault conditions. The invention results in improved availability of wind turbines.

BACKGROUND OF THE INVENTION

Increased understanding of global warming and climate change is driving current interest in the development of alternate renewable energy sources, including wind and solar energy. Presently, wind energy exploitation is the fastest-growing renewable energy industry (more than 30% per annum), accounting for 2% of world electrical energy production in 2010. Nevertheless, wind is intrinsically an unreliable energy source with relatively low conversion efficiency potential because it is largely unpredictable and there is a theoretical limit to the fraction of energy that can be extracted from it. These factors make wind a relatively expensive energy source and widespread adoption of wind energy systems is dependent on finding ways to minimize the costs associated with the materials, installation, and operation of those systems.

Minimizing the cost and maintaining the quality of electrical energy from wind power requires optimal energy extraction from wind at all times. This requires the accurate monitoring of both environmental and equipment conditions, and the use of real-time algorithms for optimization of power plant operation. An additional and crucial factor in the cost of wind power is its availability a defined as $$\alpha = \frac{MTBF}{MTBF + MTTR}$$

where MTBF is the mean time between failures, assumed constant, and MTTR is the mean time-to-repair (i.e., duration of the repair). The availability of many wind turbines in use today is around 98% owing to good reliability, maintenance management, and fast repairs. In spite of this, any reduction in the rate of equipment internal failures and any ways to minimize downtime for repairs are of critical importance for owners and operators of wind turbine systems. The wind turbine failures can be caused by external factors, such as lightning, fire, and earthquakes, but are most often caused by internal factors, stemming from the turbine equipment.

Surveys of wind turbine internal failures indicate that the average risk of failure per year per turbine is around 40%. The highest failure rates and longest down-times are attributed to the gearbox, electric and control systems, the yaw system, and the generator, some repairs or replacements requiring more than 200 hours. These numbers are far too high for most wind turbine owners, especially for those that operate offshore wind farms where the maintenance visits are particularly expensive and occur around once a year. The use of sensors of various types, including vibration and electrical sensors, to detect internal failures in real time is well established. However, the conventional response to the detection of internal failures is a complete shut down of the wind plant to prevent further damage. This inevitably incurs revenue loss. Waiting for the next scheduled maintenance visit to deal with the failure clearly prolongs the ongoing revenue loss, while immediate repairs would incur the additional expenditure of an unplanned visit. The increase in the cost of electricity from either the down-time or the increased expenses is highly undesirable, and there has been a substantial effort in the industry to implement fault-tolerant wind turbine designs and control algorithms to address these issues.

Fault tolerance is the ability to continue operation after a fault has occurred. A wind turbine equipped with fault-tolerant control system could continue operation, i.e., electricity generation, even after a fault has occurred, and the fault could be repaired at some later, more convenient time without decreasing availability of the generated electricity in the intervening period. Fault-tolerance increases MTBF and, hence, the availability of the wind plant.

Publicly available statistical data on wind turbine failures show that electromechanical failures in the generator provide a significant contribution to the overall wind turbine failure rate: as high as 20% per year per turbine. The most prevalent generator faults are bearing faults, stator or armature faults (short or open circuits), broken rotor bars and end ring faults in induction machines, and rotor eccentricity-related faults. Conventionally, these faults result in shutting down the wind turbine. Numerous approaches have been proposed and some implemented to reduce the MTBF resulting from above-mentioned faults. For example, MTBF can be improved by increasing the number of electrical phases in the generator or by adding redundancy in the electrical and mechanical systems. These approaches, redundancy in particular, most often come at the cost of increased complexity, mass and price, which is very disadvantageous in the already very cost-sensitive industry of energy generation. For these reasons, the industry is seeking more advanced solutions to fault tolerance, and would greatly benefit from the development of a fault-tolerant generator assembly at little or no added cost and complexity. This application discloses a system and a method for improving the availability of wind turbines electricity generation by implementing a method for operating a wind turbine generator in the presence of certain commonly encountered generator-fault conditions.

SUMMARY OF THE INVENTION

There is a class of generator failures that occur gradually and can be detected before they develop to such an extent that they halt or catastrophically damage the generator. Their early detection can be accomplished using various sensors/monitors suitably positioned on the generator, and intelligent analysis algorithms. This application discloses a method for achieving fault-tolerant control of variable-speed variable-pitch wind turbines under the occurrence of several generator faults. The generator faults addressed by the method disclosed include but are not limited to those occurring in the stator windings (reduced resistance, or developing short circuit between the stator windings due to aging, temperature cycling, or damage) and rotor defects (either mechanical or electrical defects). The listed faults are generally associated with a specific location on the stator or the rotor, such that the peak magnetic flux periodically traverses it during the normal operation of the generator. In embodiments of the preferred method for managing the listed generator faults, the magnitude of generator torque is reduced either locally around the faulty location on the stator/rotor or globally to a safe value under which the detected fault no longer progresses. The reduction of the generator torque includes (a) torque modulation (in time) by means of modulating the effective generator load, and/or (b) reduction of wind power extraction by means of altering the blade pitch. Torque modulation means a process in which the magnitude of the rotating magnetic field is modulated as it travels along the circumference of the stator or of the rotor.

The method and system for fault management of a wind turbine described within is applicable to wind turbines and other energy generation machines. More specifically, the method and system applies to machines using synchronous and induction (asynchronous) generators without departing from the spirit of the invention.

Variable-speed variable-pitch wind turbines have two operating regions as shown in FIG. 13: A low wind speed region I where as much wind power as possible is captured and high wind speed region II where the power extracted from the wind is held constant regardless of the wind speed. The wind speed at the boundary between regions I and II is referred to as the rated wind speed, or the nominal wind speed $V_n$. For wind speeds higher than the maximum wind speed $V_{max}$ allowed by the turbine design, the wind turbine shuts down (Region III). The optimization of energy extraction from the wind is generally accomplished by adjusting the blade pitch angle β to maximize the aerodynamic performance of the blade rotor and adjusting the resistance to blades rotation as is known in the art. The rotation of the blade rotor is in most cases converted to higher rate rotation of the generator rotor using a gearbox. The resistance to rotation is delivered by the generator torque $T_g$, and consequently, the mechanical power extracted from the wind is quantified as the product of generator angular velocity $\omega_g$ and the generator torque $T_g$.

FIG. 14 shows qualitatively the relationship between the mechanical power $P_m$ extracted from the wind ($P_m = \omega_g \cdot T_g$) and the angular velocity $\omega_g$ of the generator rotor (or the blades): it shows that for every wind speed there is an angular velocity for which the extraction is optimal, shown by "max power points" in FIG. 14. Maintaining the wind turbine along the optimal power extraction locus is accomplished by adjusting the generator torque $T_g$ which resists the spinning of the rotor blades while the blade pitch angle β is kept constant (set to optimal). This approach is employed in region I, up to the nominal wind speed $V_n$. Above the nominal wind speed, in region II, the rotor blade pitch β is adjusted to limit the angular velocity and the torque to the nominal value $\omega_{gn}$ and $T_{gn}$, respectively.

Modern wind plants include a number of sensors that continuously monitor the operation of the plant, sense faults, and in recent times, sense also slowly developing failures and pre-failure events. In the case of common generator faults, early fault warnings include but are not limited to the detection of decreased resistance between adjacent windings on the stator, asymmetry in current draw, or reduced resistance between the stator and chassis, excessive vibration, and eccentricity of the generator rotor. Presently, fault management protocol mandates that the wind turbine is to be shut down when one of the above-mentioned faults is detected, even if an early warning of a developing problem is issued. Shutting down means rotating the blades at 90° pitch angle and halt the turbine rotation by reducing the aerodynamic torque to zero. Energy production therefore also drops to zero.

There is a class of generator failures that occur gradually and can be detected sufficiently early in their development such that a corrective action can be employed to halt further fault progress. These types of faults are generally associated with a specific location on the stator or the rotor ("fault location"), such that the peak magnetic flux periodically traverses it during the normal operation of the generator. For purposes of this application, a "fault condition" refers to a wind turbine within which a generator fault has been detected, while the "fault location" refers to a physical location where the fault has been detected. Fault location is specified by mechanical or electrical angles or angular ranges on the rotor or the stator relative to some predetermined reference. The generator fault, such as a stator winding fault, is located by specifying a range of mechanical or electrical angles (relative to a reference that is fixed with respect to the stator or to the rotating magnetic field). The fault condition at specific location is furthermore characterized with a maximum torque value at the fault location under which the fault is expected not to progress, i.e., expected to remain stable. The torque is proportional to the magnitude of the rotating magnetic flux and to the magnitude of the torque building current.

In one embodiment of the present invention, upon identifying a fault at a fault location in a stator of a synchronous generator, the magnitude of the rotating magnetic flux in the stator and/or the magnitude of the torque building current are modulated in position along the circumference of the stator so that they provide a reduced time derivative of flux linkage and possibly a reduced torque at the fault location. In this case, the location where the reduced torque occurs is fixed relative to the stator.

In another embodiment of the present invention, upon identifying a fault at a fault location in a rotor of an asynchronous generator, the magnitude of the rotating magnetic flux and/or the magnitude of the torque building current is modulated in position along the circumference of the rotor so that they provide a reduced torque at the location of the fault. In this case, the region of lower torque rotates with the angular velocity equal to the rotor angular velocity.

In one embodiment of the present invention, upon identifying a fault at a fault location in a stator of an induction generator, the magnitude of the rotating magnetic flux in the stator and/or the magnitude of the torque building current are modulated in position along the circumference of the stator so that they provide a reduced time derivative of flux linkage and possibly a reduced torque at the fault location. In this case, the location where the reduced torque occurs is fixed relative to the stator.

In another embodiment of the present invention, upon identifying a fault at a fault location on either a stator or a rotor, the magnitude of the rotating magnetic flux and/or the magnitude of the torque building current are set to predetermined values at a fault location along the circumference of the stator or the rotor.

In another embodiment of the present invention, the magnitude of the rotating magnetic flux and/or the magnitude of the torque building current are modulated to predetermined values at positions along the circumference of the stator or the rotor that do not include the fault location.

In another embodiment of the present invention, the magnitude of the rotating magnetic flux and/or the magnitude of the torque building current are reduced to first predetermined values on at least one part of the stator circumference and increased to another predetermined values at positions along the circumference of the stator that do not include said at least one part.

In another embodiment, a generator having a stator operates at a first average torque; after detecting a generator fault condition, the magnitude of the rotating magnetic flux and/or the magnitude of the torque building current are reduced to lower predetermined values on at least one part of the circumference of the stator and increased to higher predetermined values at positions along the circumference of the stator that do not include said at least one part, the resulting average torque having a second average value, said first average value being substantially equal to said second average value.

In another embodiment, a wind turbine having at least one blade and a generator having a stator operates at a first average torque value with a first blade pitch; after detecting a generator fault condition, the magnitude of the rotating magnetic flux and/or the magnitude of the torque building current are reduced to lower predetermined values on at least one part of circumference of the stator and increased to higher predetermined values at positions along the circumference of the stator that do not include said at least one part, and with a second blade pitch, the torque now having a second average value, said second average torque value being lower than said first average torque value, and said second blade pitch larger than said first blade pitch.

In another embodiment, a generator having a rotor operates at a first average torque value; after detecting a generator fault condition, the magnitude of the rotating magnetic flux and/or the magnitude of the torque building current are reduced to lower predetermined values on at least one part of the circumference of the rotor and increased to higher predetermined values at positions along the circumference of the rotor that do not include said at least one part, the resulting average torque having a second average value, said first average torque value being substantially equal to the said second average torque value.

In another embodiment, a wind turbine having at least one blade and a generator having a rotor operates at a first average torque value with a first blade pitch; after detecting a generator fault condition, the magnitude of the rotating magnetic flux and/or the magnitude of the torque building current are reduced to lower predetermined values on at least one part of the circumference of the rotor and increased to higher predetermined values at positions along the circumference of the rotor that do not include said at least one part, and with a second blade pitch, the torque now having a second average value, said second average torque value being lower than said first average torque value, and said second blade pitch larger than said first blade pitch.

In another embodiment of the present invention, a wind turbine delivers first electrical power, upon an occurrence of a generator fault, the wind turbine is operated in a fault-tolerant mode in which said wind turbine delivers second electrical power, wherein said first electrical power and said second electrical power are substantially equal.

In another embodiment of the present invention, a wind turbine operates with a first blade pitch and first angular velocity; upon an occurrence of a generator fault, the wind turbine is operated in a fault-tolerant mode characterized with a second blade pitch greater than said first blade pitch, and a second angular velocity lower than said first angular velocity, wherein a torque provided by the generator results in maximum wind energy extraction under which the fault no longer propagates or further develops.

BRIEF DESCRIPTION OF THE DRAWINGS

Hereafter the invention is described in detail referring to the figures where.

DETAILED DESCRIPTION OF THE INVENTION

Figure 1:
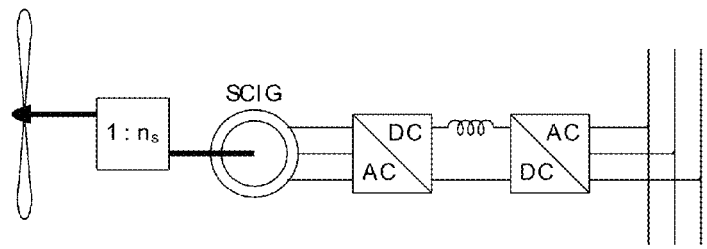
FIG. 1 shows Stator-controlled squirrel cage induction generator.

Wind turbine in principle consists of a three-blade aerodynamic system mounted on a hub, of a nacelle and of a tower. Inside the nacelle there is a drivetrain with optional gearbox and electrical subsystem with a generator and an electronic converter. There are several types of generators used in wind turbines: doubly-fed induction generator (DFIG) with a wound rotor connected to the grid through slip rings and electronic converter (EC), squirrel-cage induction generator (SCIG) with an EC connected to the stator (see FIG. 1) and a direct-drive synchronous generator (SG) coupled to the grid through an EC and with rotor slip-rings for the excitation voltage. A lot of effort is currently put into developing large-scale synchronous generators with permanent magnets.

Fault-tolerant control proposed in this application can be applied to any of listed wind turbine electrical subsystems, assuming that the generator tracks the given torque reference with certain dynamics. In the following we thus consider the generator torque tracking system as a first-order lag system. Every type of generator has its own way of speed control and it can be used to shift operating points in the generator x-axis of speed-torque plane. By using pitch control of a wind turbine aerodynamic torque can be also displaced in the y-axis. This gives the control system the ability to move the operating point with two degrees of freedom in the speed-torque plane.

Figure 2:
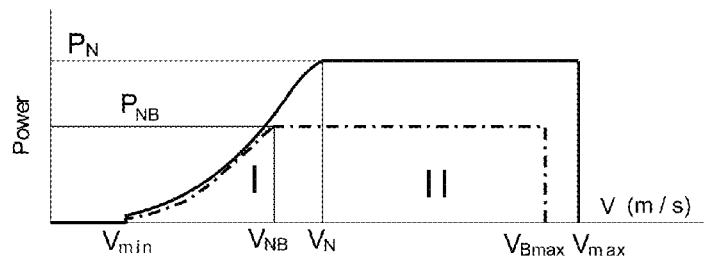
FIG. 2 shows Ideal power curve with maximum at power equal $P_N$ and power curve due to developed fault with maximum at power equal $P_{NB}$.

Taking into consideration both physical and economic constraints, the optimum point to which the wind power capture will rise is chosen, which determines the wind turbine rated power (full line in FIG. 2). Thus, operating map of the turbine is parted into a low wind speed region (region I), where all the available wind power is fully captured and high wind speed region (region II) where the power output is maintained constant while reducing the aerodynamic torque to the rated value and keeping generator speed at the rated value. The ability of a wind turbine to capture wind energy is expressed through a power coefficient $C_P$ which is defined as the ratio of extracted power $P_r$ to wind power $P_V$:

$$C_P = \frac{P_r}{P_V}. \tag{1}$$

The maximum value of $C_P$, known as Betz limit, is $$C_{Pmax} = \frac{16}{27} = 0.593.$$

Figure 3:
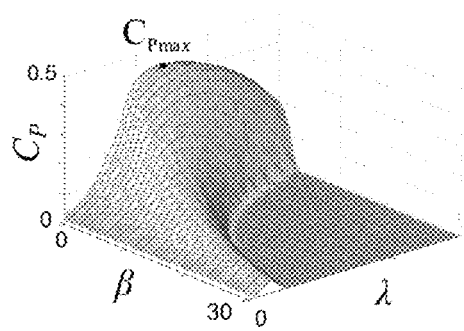
FIG. 3a) shows Power coefficient and FIG. 3b) Torque coefficient for an exemplary 700 kW variable-pitch turbine.
FIG. 3c) shows power and torque coefficients for optimal $\beta_0$ in low wind speed region ($C_P$, $C_Q$) and for $\beta=10°$ ($C_{PB}$, $C_{QB}$)
Figure 3:
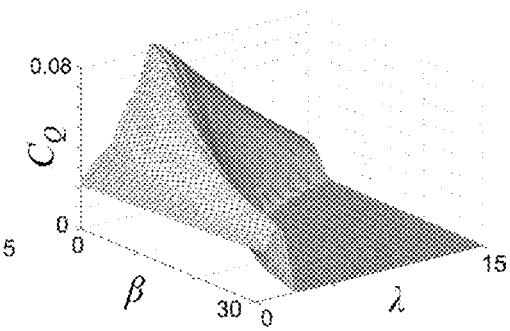
Figure 3:
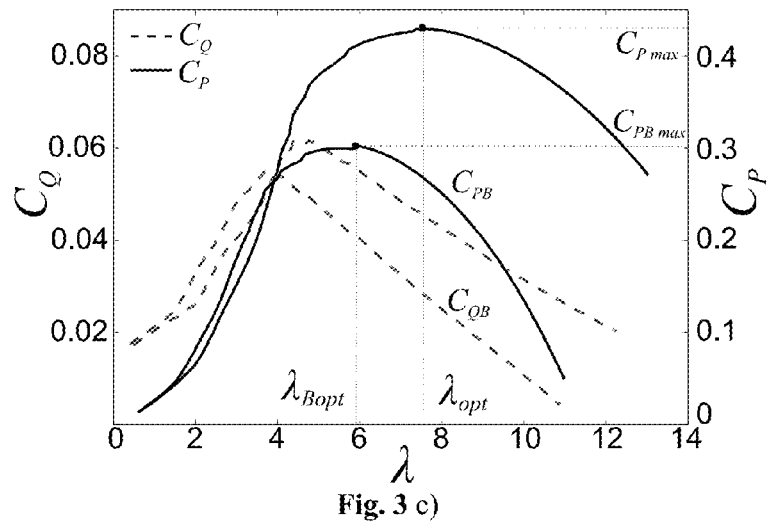

It defines the maximum theoretical capability of wind power capture. The real power coefficient of modern commercial wind turbines reaches values of about 0.48 [11]. Power coefficient data is usually given as a function of the tip-speed-ratio $\lambda$ and pitch angle $\beta$ (FIG. 3). Turbine power and torque are given by [12]

$$P_r = C_P(\lambda, \beta)P_V = \frac{1}{2}\rho R^2 \pi C_P(\lambda, \beta) V^3, \tag{2}$$

$$T_r = \frac{P_r}{\omega} = \frac{1}{2}\rho R^3 \pi C_Q(\lambda, \beta) V^2, \tag{3}$$

where $C_Q = C_P/\lambda$, $\rho$, R, V and $\omega$ are torque coefficient, air density, radius of the wind turbine aerodynamic disk, wind speed and the angular speed of blades, respectively, and $$\lambda = \frac{\omega R}{V}.$$

Figure 4:
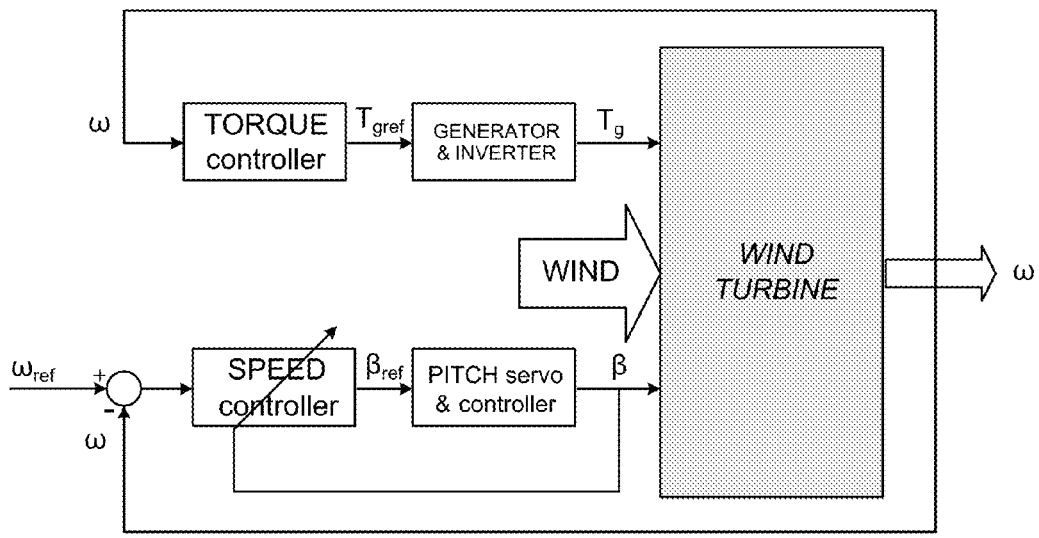
FIG. 4 shows Principal scheme of the control system of a variable-speed variable-pitch wind turbine.
Figure 5:
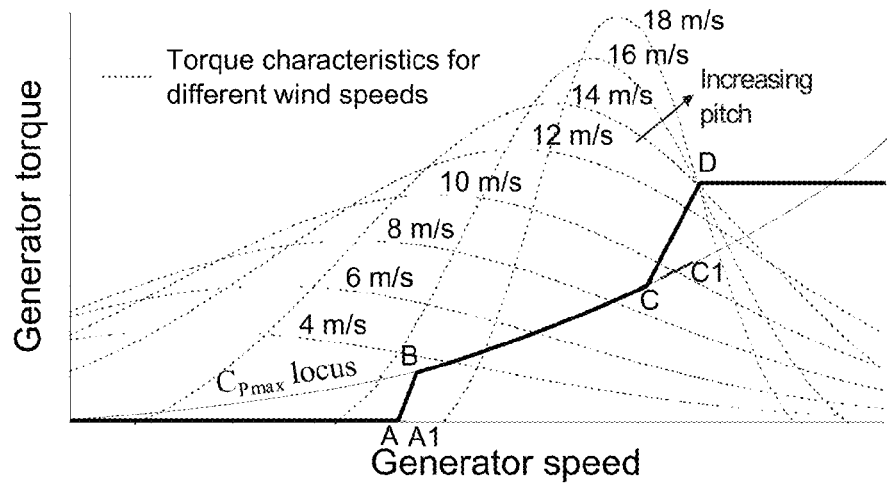
FIG. 5 shows Torque control strategy of a variable-speed wind turbine, where point A denotes the generator cut-in speed.

Since the goal is to maximize the output power in low wind speed region, wind turbine must operate in the area where the power coefficient $C_P$ is at its maximum value (or near it). This is achieved by maintaining $\lambda$ and $\beta$ on the values that ensure $C_P = C_{Pmax}$ [11]-[15], see FIG. 3. To achieve the operating point in which $\lambda$ is optimal, the generator torque and consequently the aerodynamic torque is determined by $$T_{gref} = \frac{1}{2\lambda_{opt}^3 n_s^3} \rho \pi R^5 C_{Pmax} \omega_g^2 = K_\lambda \omega_g^2, \tag{4}$$

where $n_s$ is the gearbox ratio. This way the wind turbine operating points in low wind speed region are located at the maximum output power curve, called $C_{Pmax}$ locus (BC path on FIG. 5). This $T_{gref} = K_\lambda \omega_g^2$ torque controller (depicted in the overall wind turbine control system in FIG. 4) can be easily realized using a simple look-up table.

Above the designated rated wind speed, available wind power is higher than the generator rated power and it rises rapidly along with the wind speed (see (2)). Therefore, the task of the control system is to maintain the output power of the wind turbine constant. It can be done by reducing the aerodynamic torque and angular speed of blades by rotating them along their longitudinal axis (pitching). Consequently, power captured from the wind is reduced.

Control system of the speed $\omega$ (depicted in the overall wind turbine control system in FIG. 4) is usually designed in a cascade structure with inner loop representing the servo drive position control of blades to the reference pitch angle $\beta_{ref}$ defined by the outer speed control loop. Outer loop controls the rotational speed of the wind turbine and sets it to the reference (rated) value. A proportional-integral (PI) or proportional-integral-derivative (PID) controller with gain-scheduling technique is often satisfactory for speed control.

Following the $C_{Pmax}$ locus curve, wind turbine usually reaches its rated angular speed before it reaches its rated torque. It is then desirable to increase the torque and power without any further speed increase. This is achieved by improving the torque control loop with a closed-loop controller that maintains the torque on its rated value (A1BC1D characteristic in FIG. 5). Usually smooth transition between the torque control and pitch control operating regimes of the wind turbine is enforced by deviating from the optimal power curve on edges of the low wind speed region [13], characteristic ABCD in FIG. 5.

An objective of the inventive method disclosed in this application is to (a) employ early detection of at least one of the above-mentioned generator faults, and (b) to use this early, pre-failure information to modify the control of the generator to isolate the fault (halt its progress) while continuing energy conversion. It is further an objective of the preferred method to maintain optimal energy conversion during a fault condition. Another objective of the present invention is to provide a generator and a generator control system which are fault-tolerant. Yet another objective of the preferred method is to provide a wind turbine with higher availability. It is another objective of the present invention to increase the overall energy efficiency and lower the cost per kWh of wind turbines.

In this patent application we propose a fault-tolerant control scheme for blade-pitch wind turbines with an inverter-fed generator. We focus on generator faults that can be well characterized with machine flux path areas where the generator torque should be limited to prevent fault propagation and with the maximum safety torque value in that path areas. We propose a simple extension of the classical two-loop control structure of blade-pitch wind turbines which ensures that the fault is fully respected in operation and that power delivery under fault is deteriorated as less as possible compared to healthy machine conditions.

In previous paragraphs some of the most common and reliable wind turbine control strategies are described. This section extends them to propose a fault-tolerant control approach designed to protect wind turbine components by disabling generator fault further development and to keep energy production optimal in emergency state. Common faults of an electric machine are stator winding inter-turn short circuit, rotor bar defect in case of squirrel-cage induction machines and rotor eccentricity. These faults may lead to overheating or breaking of the defected component and thus possibly to a catastrophic fault. Consequently, it triggers the safety procedure and results in a wind turbine shut-down. Whole repair process requires significant amounts of money and the situation is even worse for off-shore wind turbines. So, from this aspect, it is an interesting idea to reduce voltage or current stress on the faulty part of the generator as it operates and to anticipate such fault-tolerant behavior in overall torque-speed control of the turbine. This way, the fault development will be evaded or postponed while at the same time it will be possible to optimize the energy production in the non-healthy generator state. This increases wind turbine's total energy output and consequently its economic value.

In case of a machine fault (like damaged rotor bar or stator winding fault), magnetic flux of the machine only on a small part of its path as it moves along the circumference affects the damaged component. That part of the magnetic flux path is denoted with $\Delta\theta = \theta_2 - \theta_1$, see FIG. 6. Our primary goal is to reduce the electrical stress reflected through the generator torque in that angle span to the maximum allowed safety value $T_{gf}$. The value $T_{gf}$ is determined based on fault identification through machine fault monitoring and characterization techniques, together with flux angles $\theta_1$ and $\theta_2$. For the case of identified rotor bar damage a fault identification procedure directly outputs the safety torque value $T_{gf}$ to reduce mechanical stress on the damaged rotor bar, together with the location of the fault in the rotor magnetic flux frame (angles $\theta_1$ and $\theta_2$). For the case of identified stator winding inter-turn fault, a fault identification procedure localizes the damaged part in the stator magnetic flux frame and outputs the maximum allowed machine flux time derivative on the damaged part which can be transferred to the maximum safety torque allowed with respect to the generator speed.

Instead of torque reduction in the whole rotational period as a reaction to the fault, a fast control loop is proposed to reduce torque only in the $\Delta\theta$ section of the flux rotation path. Flux in the air-gap, and consequently torque, is therefore modulated, based on the machine flux angular position with respect to the damaged part. In case of e.g. induction generators, this method is applied using a field-oriented control (FOC) technique.

Figure 6:
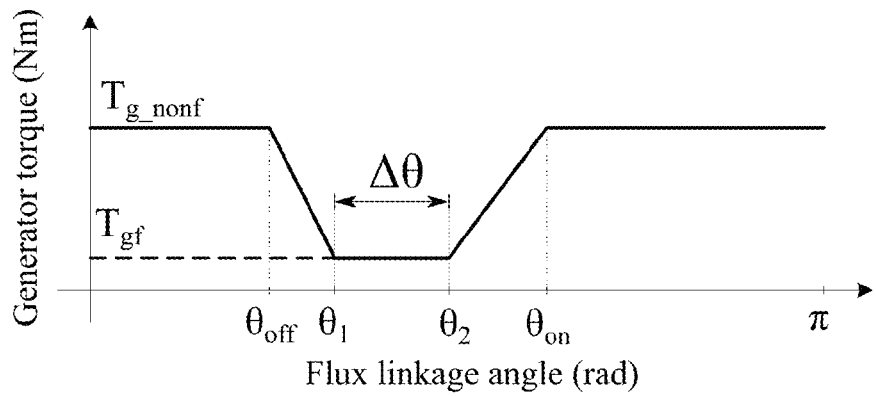
FIG. 6 shows Torque modulation due to a fault condition.

Torque modulation is shown in FIG. 6. When the flux peak in angle $\theta$ approaches the angle span $\Delta\theta$, the torque is reduced to the maximum allowed value $T_{gf}$ defined with a fault condition and, possibly, current generator speed. After the flux peak passes it, torque is restored to the right selected value $T_{g\_nonf}$. The value of $T_{g\_nonf}$ is determined such that the average machine torque is maintained on the optimal level, taking into account the machine constraints. Procedure is then periodically executed, with electrical angle period equal $\pi$, since the flux influences the faulty part with its north and south pole peak in each turn. Due to the finite bandwidth of the torque control loop, it is necessary to start reducing the torque prior to reaching the flux angle $\theta_1$, while the torque is restored to the value $T_{g\_nonf}$ at the electrical angle $\theta_{on}$ after passing $\theta_2$.

Torque transitions between steady-state operating areas are simplified and presented as linear characteristics that correspond to maximum available torque decrease/increase rate determined by maximum possible currents decrease/increase rates, i.e. by the power converter DC link constraints. Considering more realistic torque changes which would be a mix of linear and exponential functions can be also handled but is in the following presentation omitted to facilitate the mathematical treatment of the proposed method. FIG. 6 also shows that reducing the torque takes less time than restoring it. This is due to the back-electromotive force which opposes the current and thereby aggravates torque restoration. Available torque rates for generator torque decrease and increase are denoted with $\dot{T}_{g-}(\omega_g)$ and $\dot{T}_{g+}(\omega_g)$, respectively.

In the following we derive the fault-tolerant control strategy for the synchronous machine stator fault due to stator winding inter-turn fault, but similar strategy can be also derived for a faulty asynchronous machine, either for the rotor bar defect or for the inter-turn winding fault on the stator. For easier mathematical treatment we assume constant value of $T_{gf}$, although for this type of fault there exists an inverse-proportional relation between $T_{gf}$ and electrical speed. Since the generator electrical speed in case of synchronous machine is defined as $$\omega_e = p\omega_g = \frac{\Delta\theta}{\Delta t} \tag{5}$$

and duration of the torque decrease transient as $$\Delta t_{off} = \frac{T_{g\_nonf} - T_{gf}}{\dot{T}_{g-}(\omega_g)}, \tag{6}$$

by combining these two relations the following is obtained:

$$\frac{\theta_1 - \theta_{off}}{p\omega_g} = \frac{T_{g\_nonf} - T_{gf}}{\dot{T}_{g-}(\omega_g)}. \tag{7}$$

Finally, $\theta_{off}$ can be derived from (7):

$$\theta_{off} = \theta_1 - p\omega_g \frac{T_{g\_nonf} - T_{gf}}{\dot{T}_{g-}(\omega_g)}. \tag{8}$$

In the same way, $\theta_{on}$ is obtained as $$\theta_{on} = \theta_2 + p\omega_g \frac{T_{g\_nonf} - T_{gf}}{\dot{T}_{g+}(\omega_g)}. \tag{9}$$

If the torque value $T_{g\_nonf}$ can be restored at some angle, then $$\theta_{on} - \theta_{off} \leq \pi \tag{10}$$

Putting (8) and (9) into (10), the following is obtained for condition (10):

$$p\omega_g(T_{g\_nonf} - T_{gf})\left[\frac{1}{\dot{T}_{g+}(\omega_g)} + \frac{1}{\dot{T}_{g-}(\omega_g)}\right] \leq \pi - \Delta\theta. \tag{11}$$

Because of large inertia of the whole drivetrain, generator and blade system, these torque oscillations are barely noticeable on the speed transient, such that the speed is affected by the mean torque value:

$$T_{av} = \frac{1}{\pi}\int_0^\pi T_g d\theta. \qquad (12)$$

Mean value of the generator torque from FIG. 6 is then given by $$T_{av} = T_{g\_nonf}\frac{\pi-(\theta_{on}-\theta_{off})}{\pi} + \frac{T_{gf}+T_{g\_nonf}}{2} \cdot \cdot \frac{\theta_1-\theta_{off}}{\pi} + \qquad (13)$$
$$T_{gf}\frac{\theta_2-\theta_1}{\pi} + \frac{T_{gf}+T_{g\_nonf}}{2}\frac{\theta_{on}-\theta_2}{\pi}.$$

Figure 7:
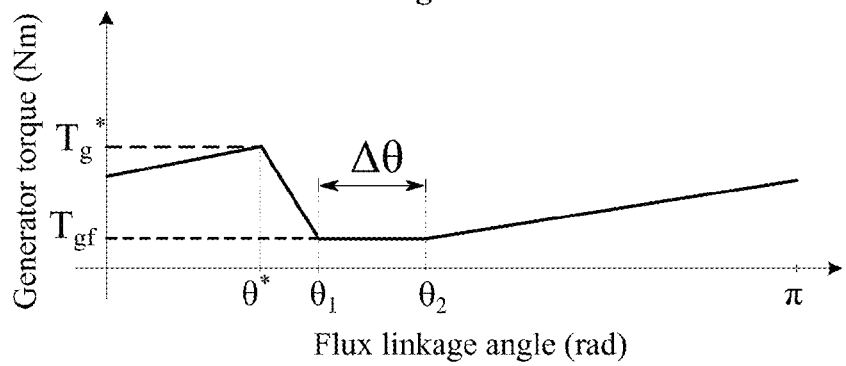
FIG. 7 shows Torque modulation due to a fault condition when $T_{g\_nonf}$ cannot be restored.

Equation (10) (or (11)) is not satisfied if the speed $\omega_g$ is large enough (or if there is a relatively large part of the flux circumference under fault influence). In that case the torque modulation is shown in FIG. 7 and peak torque $T^*_g$ is attained at angle $\theta^*$:

$$\theta_2 - \pi + p\omega_g\frac{T^*_g - T_{gf}}{\dot{T}_{g+}(\omega_g)} = \theta_1 - p\omega_g\frac{T^*_g - T_{gf}}{\dot{T}_{g-}(\omega_g)}. \qquad (14)$$

Values $T^*_g$ and $\theta^*$ can be expressed as:

$$T^*_g = T_{gf} + \frac{\pi - \Delta\theta}{p\omega_g\left(\frac{1}{\dot{T}_{g+}(\omega_g)} + \frac{1}{\dot{T}_{g-}(\omega_g)}\right)}, \qquad (15)$$

$$\theta^* = \theta_1 - \frac{\pi - \Delta\theta}{1 + \frac{\dot{T}_{g-}(\omega_g)}{\dot{T}_{g+}(\omega_g)}}. \qquad (16)$$

Mean value of the generator torque from FIG. 7 (i.e. in case when (10) is not satisfied) is now given by $$T_{av} = T_{gf}\frac{\theta_2-\theta_1}{\pi} + \frac{T_{gf}+T^*_g}{2}\frac{\theta^*+\pi-\theta_2}{\pi} ++\frac{T_{gf}+T^*_g}{2}\frac{\theta_1-\theta^*}{\pi}. \qquad (17)$$

Figure 8:
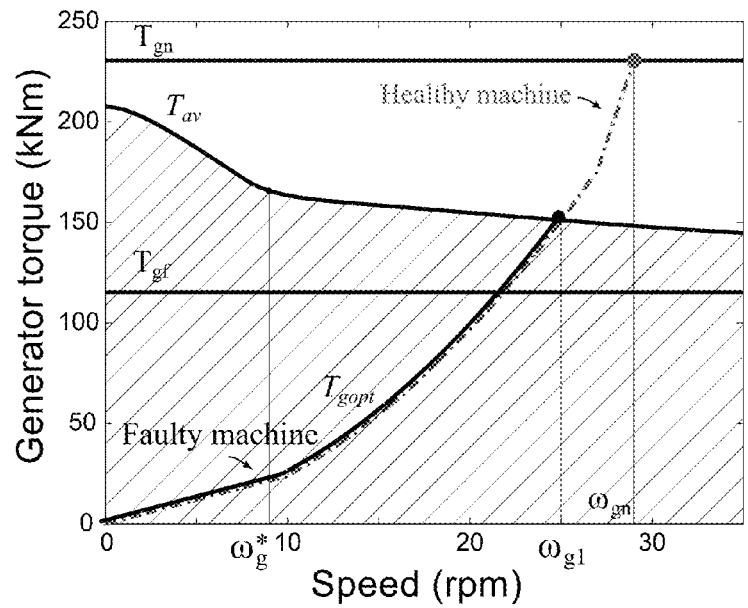
FIG. 8 shows Available torque-speed generator operating points under fault condition (shaded area). Full line is the achievable part of the wind turbine torque-speed curve under faulty condition. Dash-dot line is the healthy machine curve.

Concludingly, if (11) is fulfilled, the resulting average torque is given with (13); if not, then the resulting average torque is given with (17). On the boundary, i.e. for equality in (10) or (11), both (13) and (17) give the same torque $T_{av}$, such that $T_{av}(\omega_g)$ is continuous. The maximum available torque $T_{g\_nonf}$ is the nominal generator torque $T_{gn}$. Replacing $T_{g\_nonf}$ in (13) with the nominal generator torque $T_{gn}$ gives the maximum available average torque under fault characterized with $\Delta\theta$ and $T_{gf}$. Replacing $T_{g\_nonf}$ with $T_{gn}$ in (11) will result in speed $\omega^*_g$ up to which it is possible to restore the nominal torque in the generator in case of the considered fault. Above $\omega^*_g$, (17) holds for the average torque. FIG. 8 shows an exemplary graph of available speed-torque points under machine fault, where the upper limit is based on relations (11), (13) and (17) with $T_{g\_nonf}=T_{gn}$. Dashed area denotes all available average generator torque values that can be achieved for certain generator speed.

Figure 9:
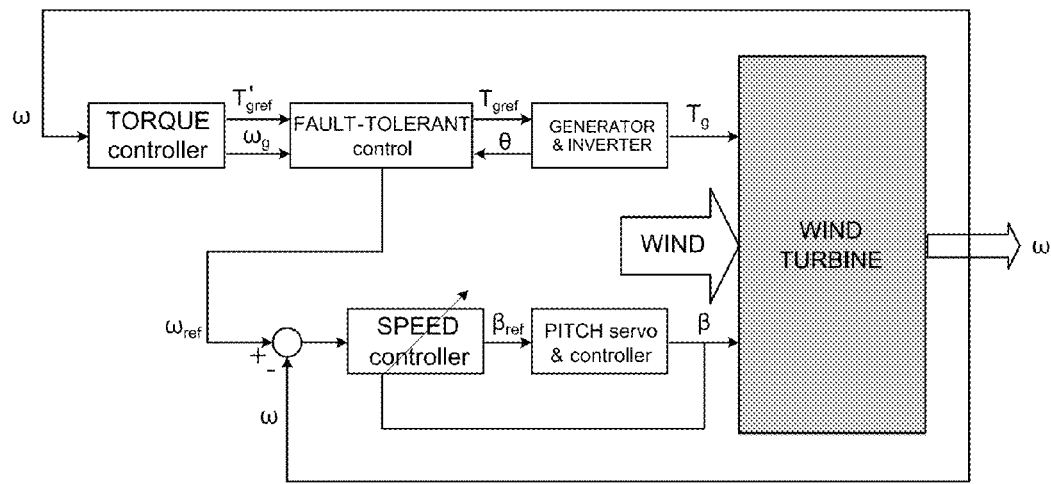
FIG. 9 a) shows Control system of wind turbine with fault-tolerant control strategy and 9 b) shows Enlarged fault-tolerant control block.
Figure 9:
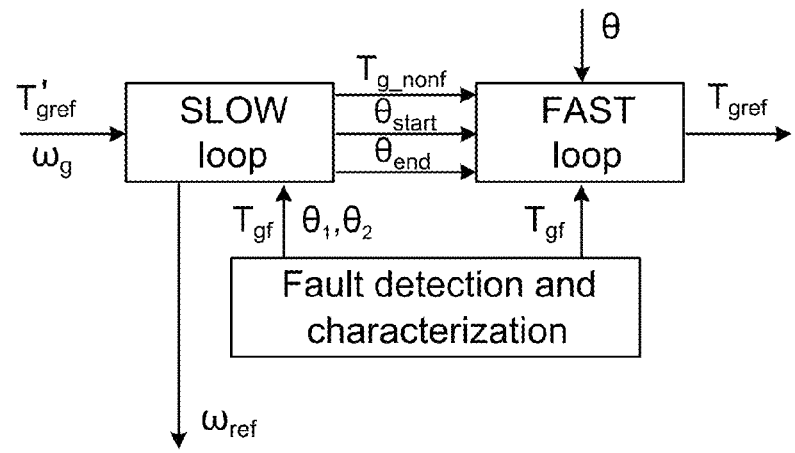

From FIG. 8 it follows that up to the speed $\omega_{g1}$ it is possible to control the wind turbine in the faulty case without sacrificing power production. However, from that speed onwards it will be necessary to use blades pitching in order to limit the aerodynamic torque (e.g., $C_{PB}$ and $C_{QB}$ in FIG. 3) and to keep the power production below optimal in order to suppress the fault from spreading. The speed control loop is modified such that instead of reference $\omega_n$ the reference $\omega_1$ (in case of gearbox, $W_1=\omega_{g1}/n_s$) is selected. This activates pitch control once the right edge of the feasible-under-fault optimal torque characteristics is reached. The optimal power point on $T_{av}(\omega_g)$, which is always on the upper edge of the dashed area, may deviate from this point and thus further improvements in power production outside the point $(\omega_{g1},T_{av}(\omega_{g1}))$ may be obtained by using maximum power tracking control along the curve of maximum $T_{av}$ in the speed span $[\omega_{g1},\omega_{gn}]$. The interventions in classical wind turbine control that ensure fault-tolerant control are given in FIG. 9. Algorithms of the slow and the fast fault-tolerant control loops are given in the sequel.

Fault-Tolerant Control Algorithm, Slow Loop

Compute $T_{g\_nonf}$ from (8), (9) and (13) such that $T_{av}(\omega_g)=T_{gref}$; if $T_{g\_nonf}>T_{gn}$, set $T_{g\_nonf}=T_{gn}$;

If (11) is fulfilled set $\theta_{start}=\theta_{off}$ mod$\pi$ else compute $\theta^*$ from (16) and set $\theta_{start}=\theta^*$ mod$\pi$ and $T_{g\_nonf}=T_{gn}$; set $\theta_{end}=\theta_2$;

Compute $\omega_{g1}$ as a speed coordinate of the intersection point of $T_{av}(\omega_g)$ and of the normal wind turbine torque controller characteristics, compute $\omega_1=\omega_{g1}/n_s$ and set $\omega_{ref}=\omega_1$.

Fault-Tolerant Control Algorithm, Fast Loop

On the positive edge of logical condition $\theta>\theta_{end}$ set $T_{gref}=T_{g\_nonf}$. On the positive edge of the logical condition $\theta>\theta_{start}$ set $T_{gref}=T_{gf}$.

SIMULATION RESULTS

Figure 10:
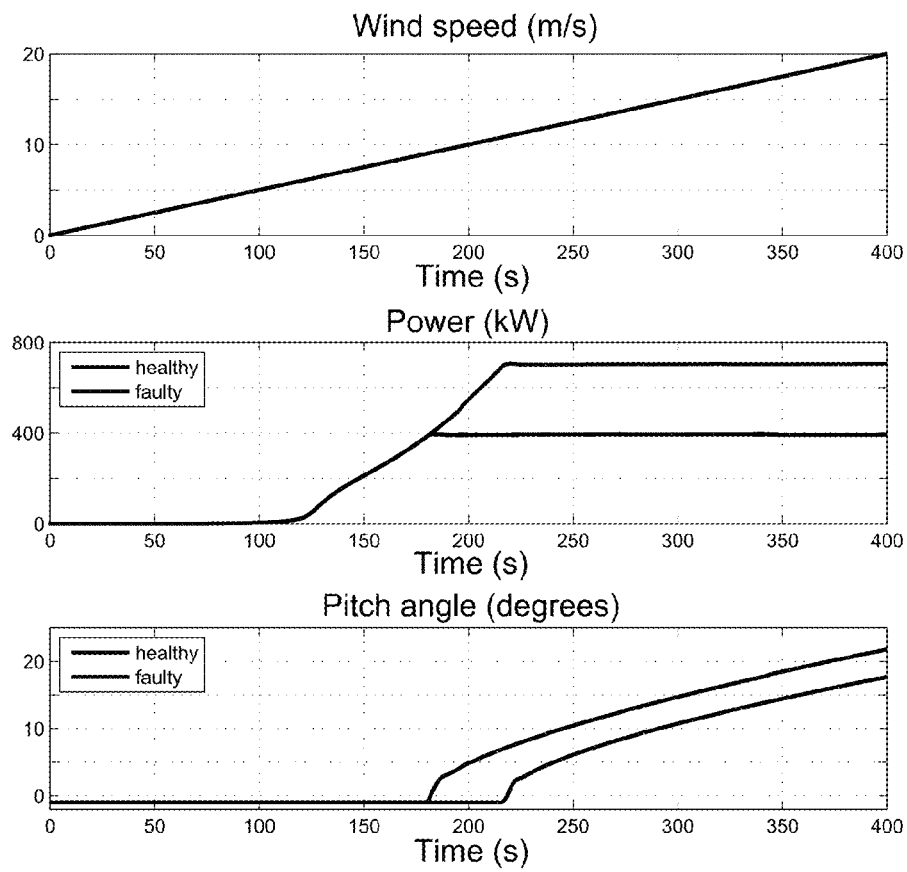
FIG. 10 shows Wind turbine output power and pitch angle for healthy and faulty conditions under linear change of the wind speed throughout the wind turbine operating area.

This section provides simulation results for a 700 kW MATLAB/Simulink variable-speed variable-pitch wind turbine model. The direct-drive 60-pole synchronous generator torque control system is modelled as a first-order lag system with time constant $\tau_{gen}=0.02$ s. Turbine parameters are: $C_{Pmax}=0.4745$, $R=25$ m, $\lambda_{opt}=7.4$, $\omega_n=29$ rpm and $T_{gn}=230.5$ kNm. Fault is simulated between flux angles $$\theta_1 = \frac{\pi}{2}$$

and $$\theta_2 = \frac{\pi}{2} + \frac{\pi}{5},$$

with $T_{gf}=0.5T_{gn}$ and presented fault-tolerant control algorithm is applied. Results in FIG. 10 show how the wind turbine behaves in healthy and faulty condition for a linear change of wind speed through the entire wind turbine operating area.

Figure 11:
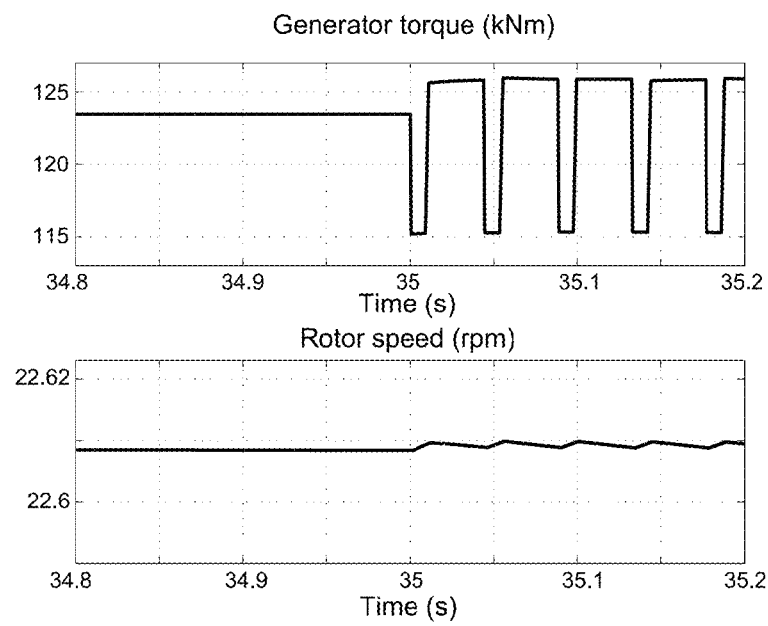
FIG. 11 shows Generator torque modulation and wind turbine speed when the operating point of healthy machine is feasible under fault. Fault occurs at 35 s.

FIG. 11 shows the fault-tolerant control system reaction to the fault that is identified in t=35 s for the case when the average generator torque under fault $T_{av}(\omega_g)$ can be equal to the required torque $T'_{gref}$ for the incurred speed $\omega_g$, i.e. the optimum speed-torque point is in the dashed area of FIG. 8 for the occurred fault.

Figure 12:
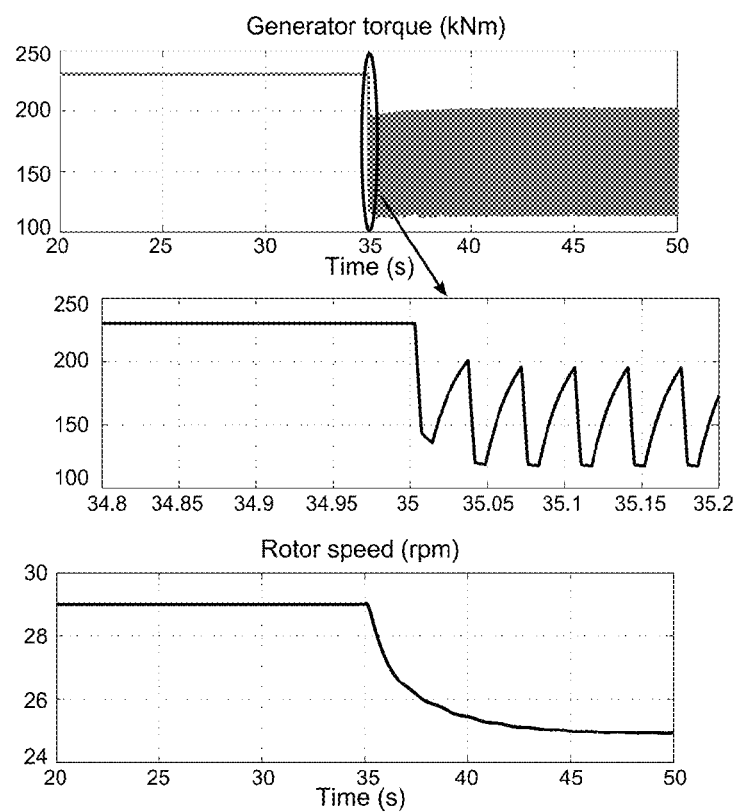
FIG. 12 shows Generator torque modulation and wind turbine speed when the operating point of healthy machine is not feasible under fault. Fault occurs at 35 s.
Figure 13:
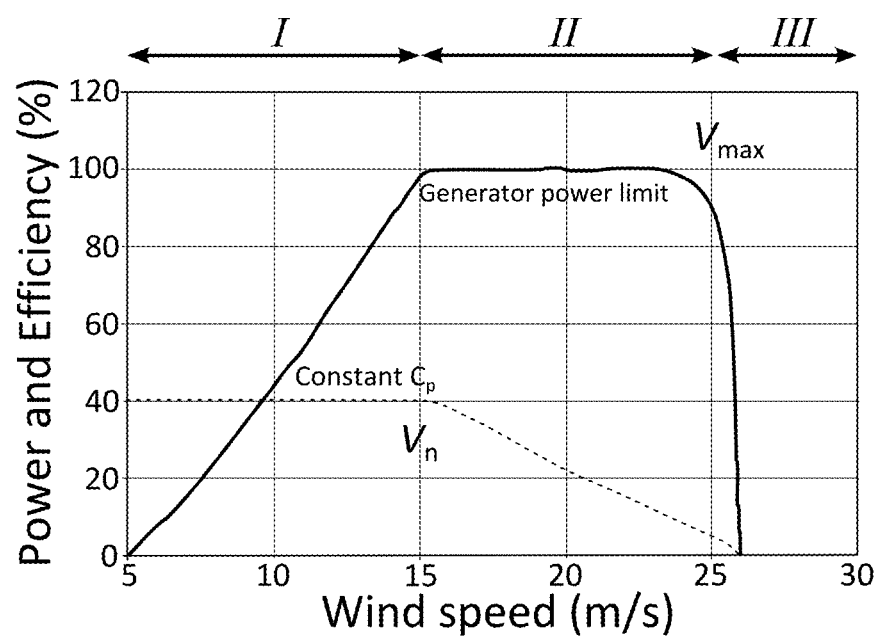
FIG. 13 shows Three distinct control regions of a wind turbine depending on the wind speed.
Figure 14:
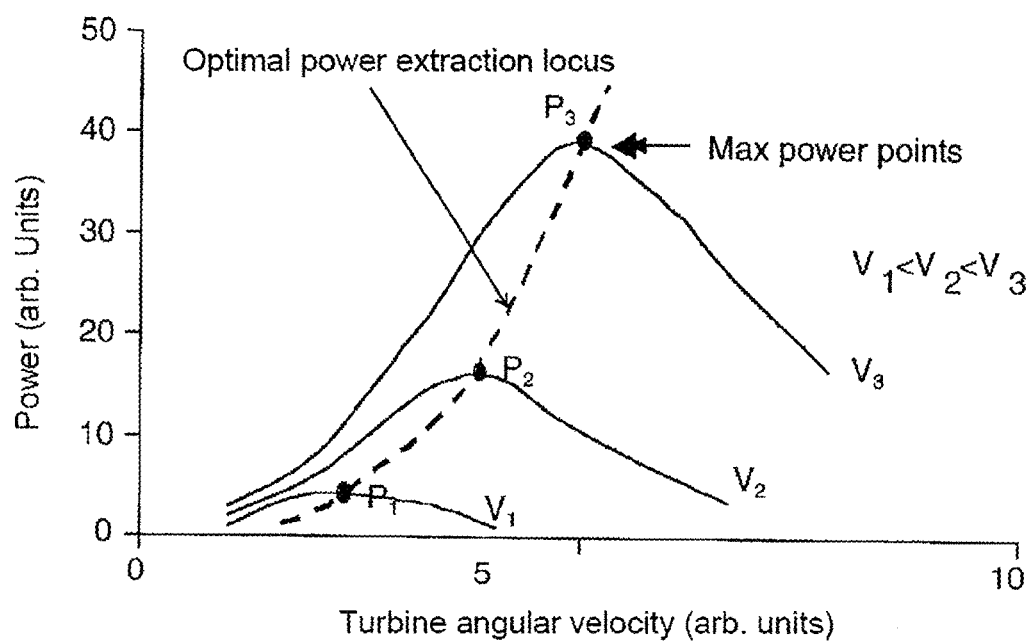
FIG. 14 shows Wind turbine vs. rotor speed characteristics at different wind speeds. The peak power point moves to the right at higher wind speeds.
Figure 15:
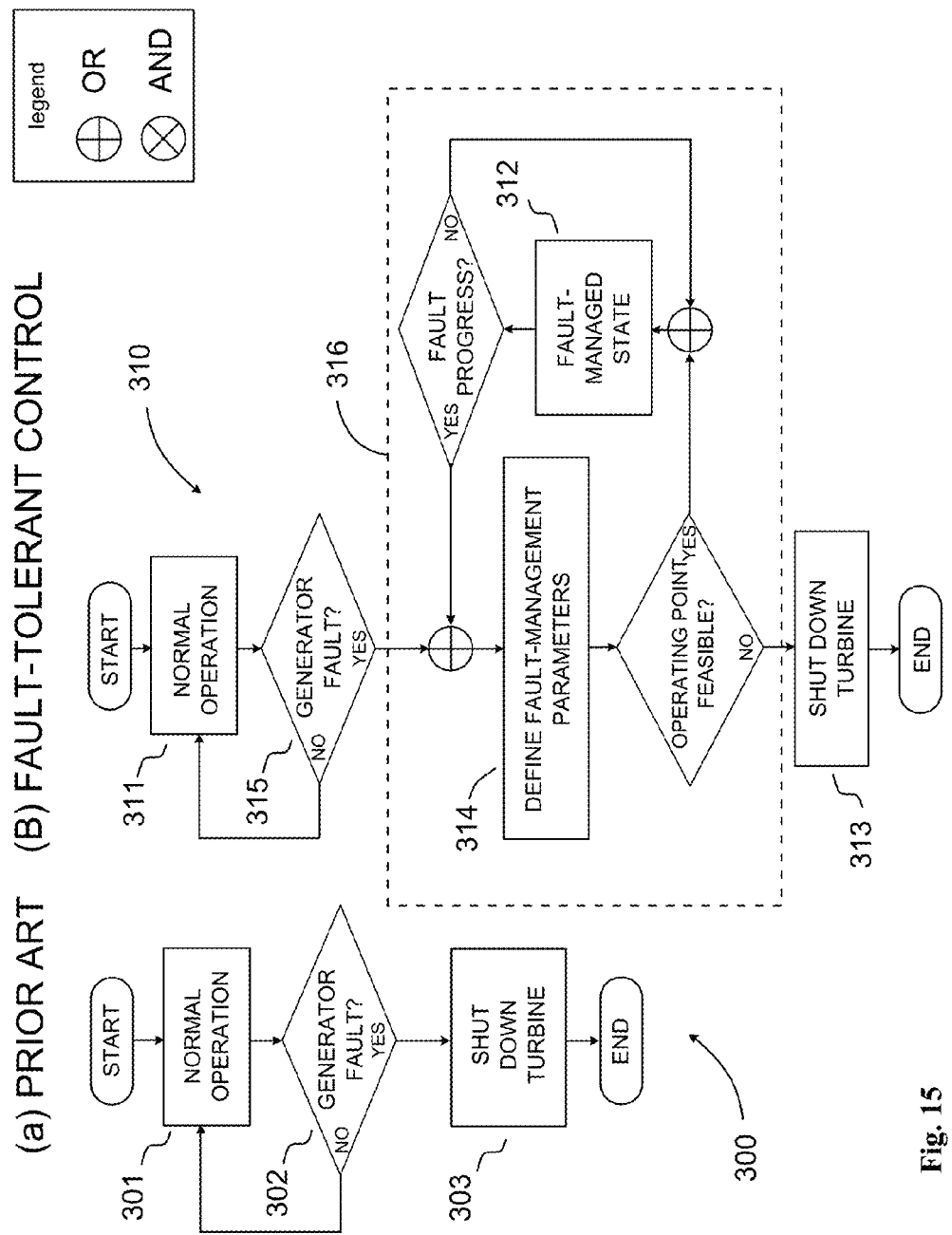
FIG. 15 shows Block diagram illustrating the operating sequence when generator fault condition is detected: (a) conventional procedure (prior art), and (b) preferred method disclosed in this application.

FIG. 12 shows the fault-tolerant control system reaction to the fault identified in t=35 s for the case when the incurred healthy machine speed-torque operating point falls out of the dashed area of FIG. 8. In this case blade pitching is used in the faulty condition to bring the speed-torque operating point into $(\omega_{g1},T_{av}(\omega_{g1}))$ An exemplary method of fault management of a wind turbine and its improvement over prior art is illustrated in FIG. 15. In prior art operating control method 300 (FIG. 15a), the wind turbine operates normally, i.e., in normal operation state 301, while continuously assessing the health of the generator, and upon detection 302 of a fault condition in the generator, the wind turbine is shut down to state 303. In the preferred embodiment 310, illustrated in FIG. 15b, a wind turbine operates in a normal operation state 311, while a generator monitoring subsystem continuously senses the condition of the generator. Upon the detection of a generator fault condition in 315, the operating control initiates fault-management sequence schematically enclosed in the dashed box 316. The fault-management sequence comprises of first determining fault-management parameters at 314 based on data provided by the generator monitoring subsystem. If the operation of the turbine is not feasible with the fault-management parameters, the wind turbine is shut down to state 313. If on the other hand, the turbine operation is feasible with the fault-management parameters, the operating control moves to a fault-managed state 312. While in the fault-managed state 312, energy generation continues and the generator monitoring subsystem continues to monitor the state of the generator. Should the detected fault further progress or any new generator fault be detected while in fault-managed state 312, the operating control initiates the fault-management sequence at 314 again. The described preferred method for fault-management of a wind turbine generator is hence adaptable. Feasible operation means operating the turbine with the generator speed above the generator cut-in speed.

In one embodiment of the present invention, a method for fault-tolerant control of a wind turbine including a generator comprises: if no generator fault condition is detected, operating said turbine in a normal state; and if a generator fault condition is detected, carrying out the steps of (1) providing fault management parameters corresponding to said detected fault; and (2) determining whether continued operation of said turbine with said fault management parameters is feasible; wherein if said continued operation is determined to not be feasible with said fault management parameters, said turbine is shut down; and if said continued operation is determined to be feasible with said fault management parameters, said turbine is operated in a fault-managed state using said fault management parameters, and progression of said generator fault is monitored, such that if said fault progresses to a predetermined level, new values for said fault management parameters are provided, and step (2) is repeated.

The algorithm for operation under fault condition comprises of reducing the torque in the faulty part of the generator as it operates and to anticipate such fault-tolerant behavior in overall torque-speed control of the turbine. In this way, the fault development will be evaded or postponed while at the same time it will be possible to optimize the energy production in the non-healthy generator state. This increases wind turbines total energy output and consequently its economic value.

The preferred method for fault-tolerant control of a wind turbine disclosed in this application comprises of providing a generator including an adaptive control algorithm with two control loops: a fast control loop for modulation of the generator torque along the circumference of the rotating magnetic flux, and a slow control loop that ensures the generator placement at a point of its speed-torque plane where it is possible to: (i) protect the generator and other wind turbine components from further damage by preventing further development of the detected fault and (ii) keep the electrical energy production optimal under emergency circumstances. The invention disclosed within applies to all electrical generators used in wind turbines.

In one embodiment of the present invention, the fault-management control comprises two control loops: the slow control loop and the fast control loop. The fast control loop modulates the torque during the rotation of the magnetic flux. The slow loop adjusts the generator angular velocity using the average torque and the blade pitch, if necessary in order to protect the generator from further fault development and to optimize the electrical energy production during the fault-managed state.

Figure 16:
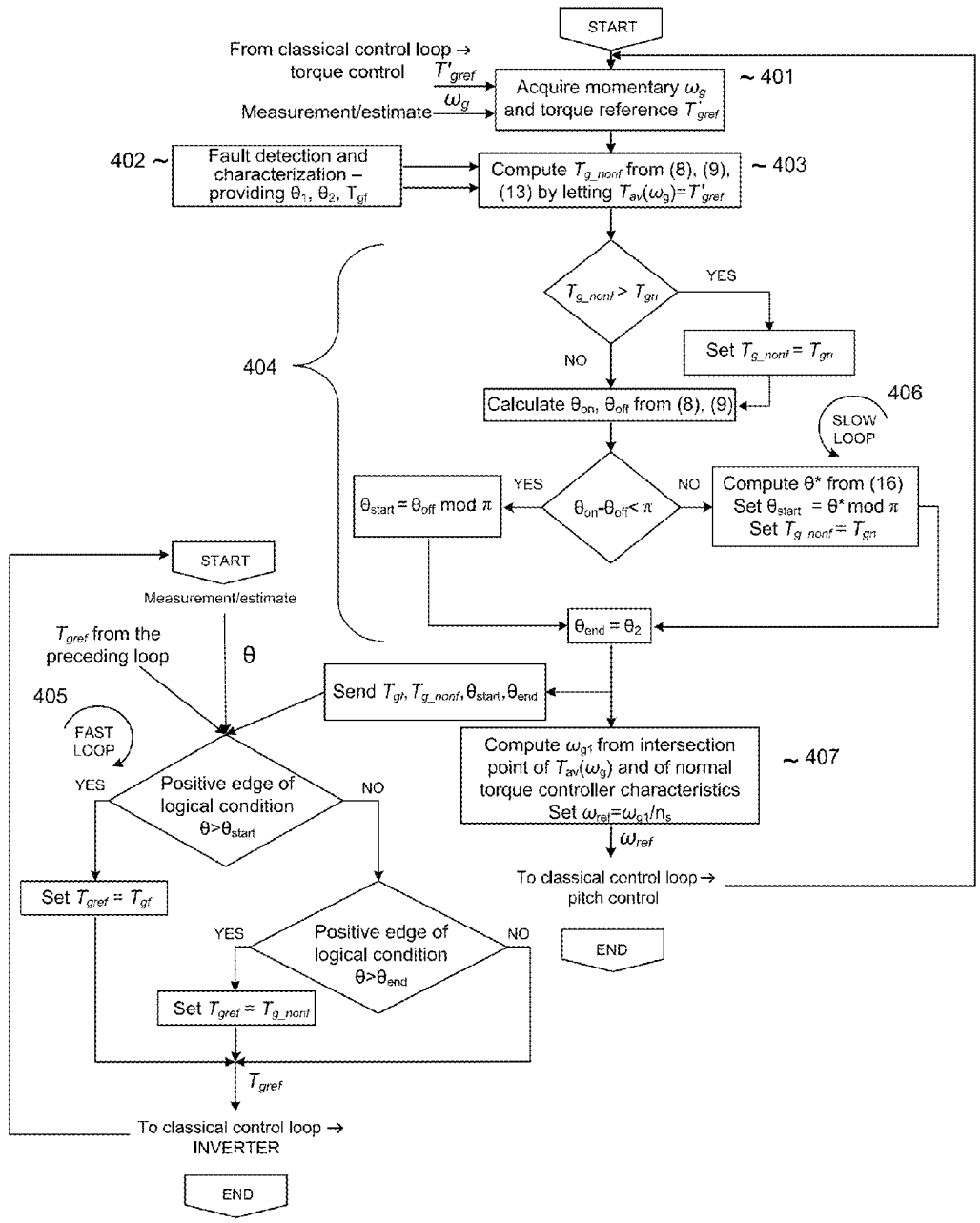
FIG. 16 shows Block diagram illustrating the preferred method for operating a wind turbine under fault condition.

Another embodiment of the present invention is illustrated in FIG. 16. The first step is the acquisition of the momentary angular velocity of the generator $\omega_g$ and the associated required generator torque $T'_{gref}$ 401. Upon detection of a fault, the fault detection algorithm establishes the location of the fault and the fault severity providing the location in terms of angles $\theta_1, \theta_2$, and the maximum allowed torque $T_{gf}$ at the fault location (step 402). It is understood that the fault may occur on the stator or the rotor of the generator. In the fault-managed state (FIG. 15, box 312), the generator torque will be modulated to exhibit reduced torque $T_{gf}$ around the location of the fault and an increased torque $T_{g\_nonf}$ in all other areas of the circumference of the magnetic flux. In the presence of torque modulation, in the preferred method control system first decides what is the higher value of the torque $T_{g\_nonf}$ (step 403) necessary to maintain unchanged average torque and angular velocity on the generator. The higher value $T_{g\_nonf}$ is capped to the nominal torque value and the torque modulation angles are determined in step 404. (In the blocks, the numbers in parentheses indicate equations from the previous paragraphs. These equations may vary with the fault type, the one considered here is the stator winding fault of a synchronous generator). The modulation angles are fed to the fast loop 405 to control the torque modulation depending on the position of the rotating magnetic flux, while the same information is also used to compute required angular velocity $\omega_{g1}$ from the intersection point between $T_{av}(\omega_g)$ and normal torque controller characteristics in step 407, the resulting angular velocity $\omega_{g1}$ is then fed back to the wind turbine control loop, including blade pitch control. If the fault has progressed beyond a predetermined point (not shown in FIG. 16) and the turbine operation became unfeasible, the turbine is shut down and the method concludes. Feasible operation of the wind-turbine means operation at an angular velocity above the generator cut-in speed.

It is apparent that the above embodiments may be altered in many ways without departing from the scope of the invention. It is understood that although the preferred method has been disclosed as applied to synchronous generators, other types of generators, such as, asynchronous generators can be controlled using the same invented approach without departing from the scope of the invention. Further, various aspects of a particular embodiment may contain patentable subject matter without regard to other aspects of the same embodiment. Additionally, various aspects of different embodiments can be combined together. Also, those skilled in the art will understand that variations can be made in the number and arrangement of components illustrated in the above diagrams.

What is claimed is:

1. A method for fault-tolerant control of a wind turbine including a generator and a generator monitoring subsystem which continuously senses the condition of the generator and provides to the fault-tolerant control system fault management parameters, either as reduced time derivative of stator flux linkage in a faulty stator phase wherein the magnitude of the rotating magnetic flux and/or the magnitude of the torque building current is manipulated in such a way that time derivative of stator flux linkage is kept below the given reduced value at the fault location, or as fault localizing angles $\theta_1, \theta_2$ and the maximum allowed torque $T_{gf}$ at the fault location on the generator magnetic flux circumference wherein said method reduces magnitude $T_g$ of the generator torque locally around the fault location such that the fault does not further progress and the energy production is deteriorated as less as possible, said method comprising the following steps:

if no generator fault condition is detected, operating said wind turbine in a normal state; and if a generator fault condition is detected, carrying out the steps of:

(1) acquisition of the momentary angular velocity of the generator $\omega_g$ and the associated required generator torque $T'_{gref}$ and providing fault management parameters $\theta_1$, $\theta_2$, $T_{gf}$ corresponding to said detected fault;

(2) control system decides what is the higher value of the torque $T_{g\_nonf}$ necessary to maintain unchanged average torque and angular velocity of the generator;

(3) the value $T_{g\_nonf}$ is capped to the nominal torque value T, and the torque modulation angles $\theta_{on}$, $\theta_{off}$ are computed;

(4) computing the angle value $\theta_{start}$ needed for torque modulation and setting $T_{g\_nonf}$ to $T_g^*$ if the difference between $\theta_{on}$ and $\theta_{off}$ is greater than $\pi$;

(5) setting the angle value $\theta_{end}$ needed for torque modulation;

(6) performing torque modulation based on values $T_{gf}$, $T_{g\_nonf}$, $\theta_{start}$ and end such that the torque is maintained at the fault location on the value $T_{gf}$ while at the remaining part of the generator magnetic flux circumference the torque $T_g$ is maintained such that the average torque value $T_{av}$ is on the required level;

(7) computing the generator speed value $\omega_{g1}$ and setting wind turbine speed reference $\omega_{ref}$ of the wind turbine speed control system accordingly, wherein the wind turbine operation is feasible if generator speed value $\omega_{g1}$ is greater than the generator cut-in speed.

2. The method according to claim 1 wherein said fault-tolerant control system comprises a first control loop—slow loop and a second control loop—fast loop nested within said first control loop, said first control loop controlling turbine blade pitch angle β, and said second control loop controlling generator torque $T_g$.

3. The method according to claim 1 wherein said detected generator fault condition is caused by a defect in a stator of the generator of said wind turbine.

4. The method according to claim 3 wherein said defect is located in a region bounded by two planes that intersect along the axis of said stator, said planes forming an angle at said axis.

5. The method according to claim 1 wherein said detected generator fault is caused by a defect in a rotor of the generator of said wind turbine.

6. The method according to claim 5 wherein said defect is located in a region bounded by two planes that intersect along the axis of said rotor, said planes forming an angle at said axis.

7. The method according to claim 1 wherein said generator is a synchronous generator.

8. The method according to claim 1 wherein said generator is an induction generator.

9. A method for fault-tolerant control of a wind turbine including a generator and a generator monitoring subsystem which continuously senses the condition of the generator and provides to a fault-tolerant control system fault management parameters in terms of faulty stator phase and the maximum allowed derivative of the stator fux linkage in the faulty stator phase, wherein said method manipulates the magnitude of the rotating magnetic flux in the stator and/or the magnitude of the torque building current in such a way that time derivative of stator flux linkage is kept below the maximum allowed value at the fault location.

10. The method according to claim 9 wherein said generator is a synchronous generator.

11. The method according to claim 9 wherein said generator is an induction generator.

12. A wind turbine system including:

a generator;

a generator monitoring subsystem having sensors for continuously sensing either maximum allowed stator flux linkage time derivative in a faulty phase or fault localizing angles $\theta_1$, $\theta_2$ and the maximum allowed torque $T_{gf}$ at the fault location on the generator magnetic flux circumference; a control system controlling a magnitude of a rotating magnetic flux in the stator and/or a magnitude of a torque building current such that either a time derivative of stator flux linkage or the magnitude $T_g$ of the generator torque are less than the maximum allowed values at the fault location.

13. The wind turbine system of claim 12, wherein said generator is a synchronous generator.

14. The wind turbine system of claim 12, wherein said generator is an induction generator.

* * * * *